(12) United States Patent
Dai et al.

(10) Patent No.: US 11,302,595 B2
(45) Date of Patent: Apr. 12, 2022

(54) PACKAGE ASSEMBLY AND METHOD FOR MANUFACTURING THE SAME, PACKAGE ASSEMBLY OF BUCK CONVERTER

(71) Applicant: Silergy Semiconductor Technology (Hangzhou) LTD, Hangzhou (CN)

(72) Inventors: Ke Dai, Hangzhou (CN); Jian Wei, Hangzhou (CN); Jiajia Yan, Hangzhou (CN)

(73) Assignee: Hefei Silergy Semiconductor Technology Co., Ltd., Hefei (CN)

( * ) Notice: Subject to any disclaimer, the term of this patent is extended or adjusted under 35 U.S.C. 154(b) by 0 days.

(21) Appl. No.: 17/025,106

(22) Filed: Sep. 18, 2020

(65) Prior Publication Data

US 2021/0098329 A1    Apr. 1, 2021

(30) Foreign Application Priority Data

Sep. 27, 2019   (CN) .......................... 201910927320.4

(51) Int. Cl.
| | |
|---|---|
| *H01L 23/36* | (2006.01) |
| *H01L 21/50* | (2006.01) |
| *H01L 23/538* | (2006.01) |
| *H02M 3/158* | (2006.01) |
| *H01L 23/60* | (2006.01) |

(52) U.S. Cl.
CPC .............. *H01L 23/36* (2013.01); *H01L 21/50* (2013.01); *H01L 23/5385* (2013.01); *H01L 23/5386* (2013.01); *H01L 23/60* (2013.01); *H02M 3/1582* (2013.01)

(58) Field of Classification Search
CPC ..... H01L 23/36; H01L 23/50; H01L 23/5385; H01L 23/5386; H01L 23/60; H02M 3/1582
See application file for complete search history.

(56) References Cited

U.S. PATENT DOCUMENTS

| | | | |
|---|---|---|---|
| 8,063,472 B2 | 11/2011 | Liu et al. | |
| 8,860,194 B2 | 10/2014 | Ma et al. | |
| 9,159,703 B2 | 10/2015 | Cho et al. | |
| 9,627,972 B2 | 4/2017 | Mao et al. | |
| 2010/0019362 A1 | 1/2010 | Galera et al. | |
| 2012/0299173 A1* | 11/2012 | Mohammed | H01L 23/373 257/686 |
| 2017/0317000 A1* | 11/2017 | Nishimura | H01L 23/13 |
| 2018/0190617 A1* | 7/2018 | Chew | H01L 23/481 |
| 2019/0148262 A1* | 5/2019 | Pei | H01L 23/485 257/713 |

FOREIGN PATENT DOCUMENTS

CN          109256363 A        1/2019

* cited by examiner

*Primary Examiner* — Peniel M Gumedzoe

(57) ABSTRACT

A package assembly can include: a die electrically connected to outer pins of the package assembly; an electronic component located above the die and electrically connected to the die, wherein the electronic component is connected to the outer pins of the package assembly through conductive pillars; and a heat dissipation structure located between the die and the electronic component to facilitate heat dissipation of the electronic component, where the heat dissipation structure physically isolates the die and the electronic component such that electromagnetic interference from the electronic component to the die is substantially prevented.

19 Claims, 6 Drawing Sheets

PACKAGE ASSEMBLY AND METHOD FOR MANUFACTURING THE SAME, PACKAGE ASSEMBLY OF BUCK CONVERTER

RELATED APPLICATIONS

This application claims the benefit of Chinese Patent Application No. 201910927320.4, filed on Sep. 27, 2019, which is incorporated herein by reference in its entirety.

FIELD OF THE INVENTION

The present invention generally relates to the field of semiconductor technology, and more particularly to a package assemblies and methods.

BACKGROUND

Power modules may typically operate under windless conditions, with the vast majority of generated heat dissipated through a printed-circuit board (PCB) connected to the power module's pins. In some approaches, the inductor is placed above the die, which further distances the inductor from the heat sink and thereby hinders heat dissipation, which may result in the hot spot being located on the inductor rather than the die. However, service temperature (e.g., 125° C.) of a normal inductor is typically lower than service temperature (e.g., 150° C.) of a wafer, thus limiting the power that a power module can handle.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
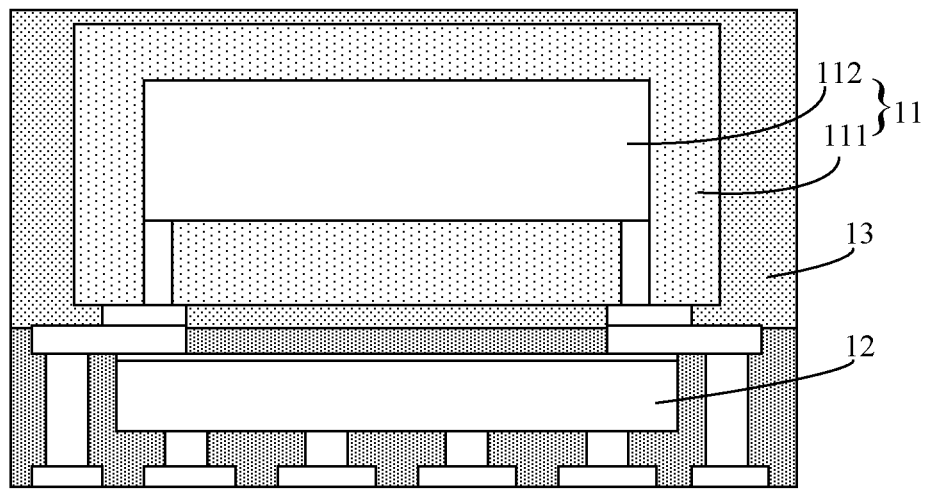
FIG. 1 is a sectional view of an example die package assembly.

In existing power modules, the inductor can mainly be transmitted through two electrode pins of the inductor. However, the inductor is in direct contact with epoxy packaging material, which may have a relatively low thermal conductivity. As shown in FIG. 1, inductor 11 is positioned above die 12, with packaging material 13 filling in the gaps between the two and thus directly in contact with the inductor. However, inductance loss of inductor 11 may not only be caused by coils 112, but also by magnetic core 111. The inductor may only transmit excess heat through its two electrode pins, depending on the particular circuit topology. In the most commonly used buck converter topology, one of the electrode pins can connect directly to the heat-generating die instead of outer pins of the power module, and in any event heat dissipation may be extremely limited.

In one embodiment, a package assembly can include: a die electrically connected to outer pins of the package assembly; an electronic component located above the die and electrically connected to the die, where the electronic component is connected to the outer pins of the package assembly through conductive pillars; and a heat dissipation structure located between the die and the electronic component to facilitate the electronic component's heat dissipation, where the heat dissipation structure physically isolates the die and the electronic component such that electromagnetic interference from the electronic component to the die can be prevented. Further, at least part of the heat dissipation structure can be exposed outside of the package assembly in order to export heat generated by the electronic component. The heat dissipation structure can include a first part located above the second surface of the die, and a second part extending towards the outside of the package assembly and connected to the first part.

Figure 2:
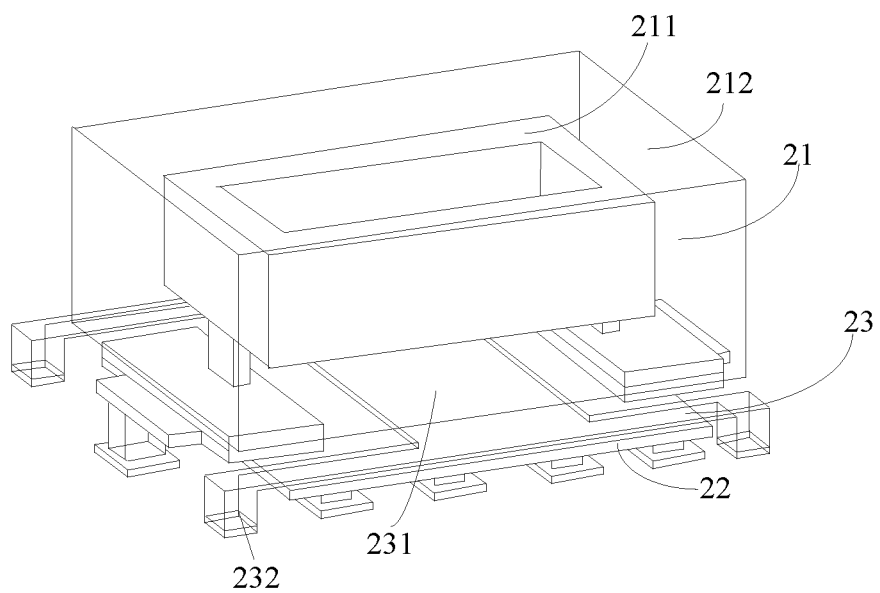
FIG. 2 is a perspective view of a first example package assembly, in accordance with embodiments of the present invention.
Figure 3:
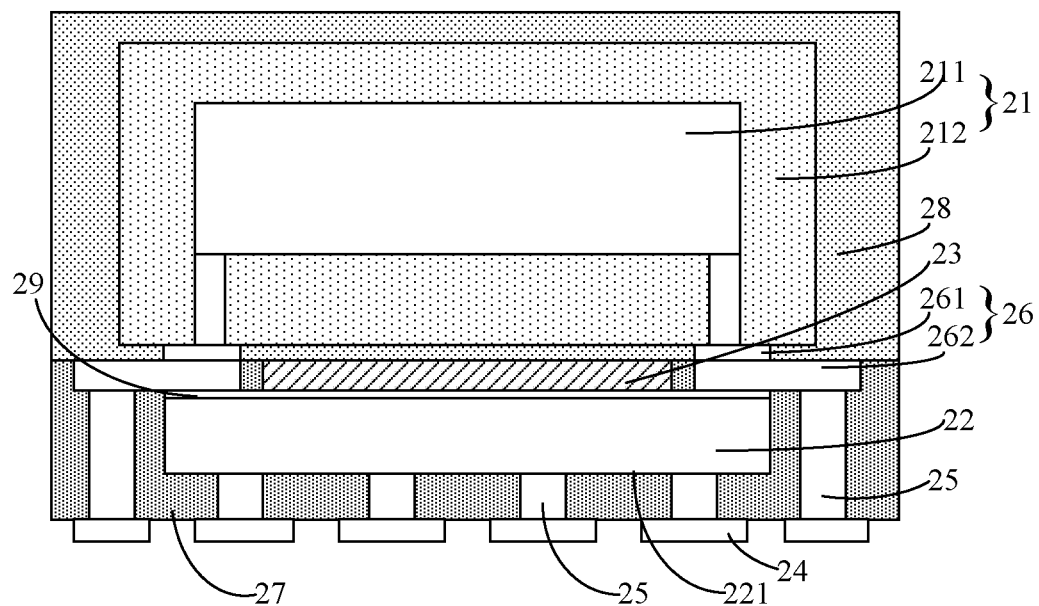
FIG. 3 is a sectional view of the first example package assembly, in accordance with embodiments of the present invention.

Referring now to FIGS. 2 and 3, shown are respective perspective and sectional views of a first example package assembly, in accordance with embodiments of the present invention. In this particular example, the package assembly can include electronic component 21, die 22, heat dissipation structure 23, and frame 24. For example, die 22 can be installed on frame 24 with its active surface 221 facing frame 24. Electronic component 21 can be located above die 22, with electronic component 21 connected to frame 24 through conductive pillars 25. Heat dissipation structure 23 can be installed between electronic component 21 and die 22 for heat dissipation of electronic component 21. For example, heat dissipation structure 23 can include part 231 located above die 22, and part 232 connected to part 231 and extending to frame 24.

The surface of part 232 in contact with frame 24 can be exposed by the encapsulator, extending outside of package assembly and connected to part 231, such that the heat from the electronic component may be transmitted directly to outer pins of the package assembly. The frame can include the outer pins of the package assembly. In this example, part 231 of the heat dissipation structure takes an H-shape and has uniform thickness throughout. Part 232 can extend to the frame along the stacked direction of die 22 and electronic component 21. Other heat dissipation structure may also be supported in certain embodiments, as long as the heat of the electronic component can be dissipated.

The package assembly can also include pad structures 26 connected to the electrodes of the electronic component. For example, the pad structure can include metal layer 262 on the back surface of the die, and solder layer 261 located on metal layer 262. For example, the active surface and back surface of die are opposite to each other. Electronic component 21 and frame 24 can form an electrical connection through pad structure 26 and conductive pillars 25. In this example, the electronic component chosen can be an inductor or a transformer. Electronic component 21 can include coil 211 and magnetic core 212. Since the thickness of solder layer 261 is relatively thin, the heat dissipation structure is essentially in contact with magnetic core 212, thus allowing heat from the electronic component 21 to be dissipated. Moreover, the shape of part 231 of the heat dissipation structure may be such that part 231 of the heat dissipation structure covers the idle space on the back surface of die as much as possible (e.g., the idle space is a space not covered by metal layer 262).

In this example, part 231 of the heat dissipation structure can be located at the peripheries of pad structure 26, and the heat dissipation structure and metal layer 262 may be isolated from one another. Further, the back surface of the die can also include a layer of insulator film 29, such as insulating paste to prevent electrodes of the electronic component from directly contacting the back surface of the die while simultaneously insulating the heat dissipation structure and metal layer from the die. Die 22 can be electrically connected with frame 24 through a plurality of conductive pillars 25. As shown in FIG. 3, the package assembly can also include encapsulators 27 and 28. Encapsulator 27 can encapsulate heat dissipation structure 23, die 22, and conductive pillars 25, and may expose a bottom surface of the conductive pillars and a bottom surface of part 232 of the heat dissipation structure.

These exposed bottom surfaces can connect to the outer pins of the package assembly to electrically connect external circuits. Because the solder layer is located on top surface of the first encapsulator, the electronic component and the heat dissipation structure may have no direct contact. Encapsulator 28 can be used to encapsulate the electronic component 21. In other examples, encapsulator 28 can be omitted and the electronic component may be exposed. Alternatively, one encapsulator can be used to encapsulate electronic component 21, heat dissipation structure 23, die 22, and conductive pillars 25. In this case, the electronic component may be in direct contact with the heat dissipation structure.

In this example, die 22 can be installed on the frame using flip-chip (FC) techniques, while in other examples, the die can be installed on the frame using wire bonding techniques. That is, the active surface of the die is facing electronic component 21 and the back surface facing the frame, with the two surfaces of the die opposite to one another. In addition, pad structure 26 of the electronic component may be located above die 22. When surface area of die 22 is relatively small, the pad structure 26 need not be in contact with the die, and may be on the sides of the die.

In this particular application, the heat dissipation structure can be formed using redistribution layer (RDL) techniques (e.g., through sputtering or plating process), or through other suitable processes/techniques. For example, the material for the heat dissipation structure can be copper, but other metal materials are also supported in certain embodiments. The heat dissipation structure can be connected to the ground potential pin to further increase heat dissipation of the electronic component. Alternatively, the heat dissipation structure can be connected to the pin of some electronic component in accordance with particular needs for certain circuit functions, or can remain suspended, for example. It should be noted that the selection of the electronic component may also permit other options, such as resistors, capacitors, and so on. Any suitable approach to realize lamination between the die and the electronic component in the package assembly can be supported in certain embodiments. In this particular application, the frame can be formed using RDL techniques, or may be formed by stamping.

In particular embodiments, the package assembly can be applied to a buck converters (buck circuit), boost converters (boost circuit), as well as buck-boost converters (buck-boost circuit). For instance, when the package component is applied to a buck converter, the selected electronic component can include an inductor, the die can be a die for integrated power device and control circuit, one of the pad structure of the electronic component can be connected to the output voltage pin, and the other of pad structure the electronic component can be connected to the switch node. The heat dissipation structure can form a conformal body with the metal layer of output voltage pin; that is, the heat dissipation structure can connect to the output voltage pin. Since a large output voltage pin may generally be laid on the PCB layout, connecting the output voltage pin with the heat dissipation structure can further benefit heat dissipation of the electronic component.

In particular embodiments, the heat dissipation structure can be located below the electronic component to facilitate its heat dissipation, and may directly transmit heat towards the outer pin of the package assembly, thereby reducing both the temperature of the electronic component and the thermal resistance of the package assembly. Moreover, due to the heat dissipation structure surrounding the pad structure of the electronic component, in some topologies (e.g., buck circuits or boost circuits), the switch nodes may also be surrounded by the heat dissipation structure, and the heat dissipation structure can play a role in shielding radiation during voltage transitions of the switch node. Furthermore, the heat dissipation structure can physically isolate the electronic component and the die, in order to prevent electromagnetic interference from the electronic component to the die. When the selected electronic component is an inductor or transformer, this can avoid the Hall effect caused by leakage flux of the magnetic element passing through the die perpendicularly during operation of the die.

Figure 4:
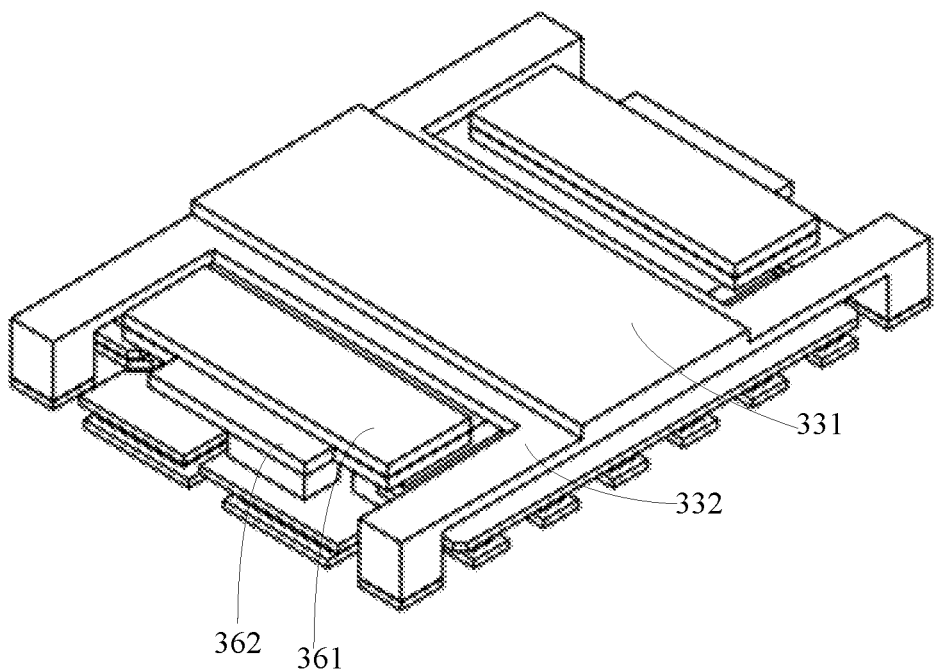
FIG. 4 is a perspective view of a part of a second example package assembly, in accordance with embodiments of the present invention.
Figure 5:
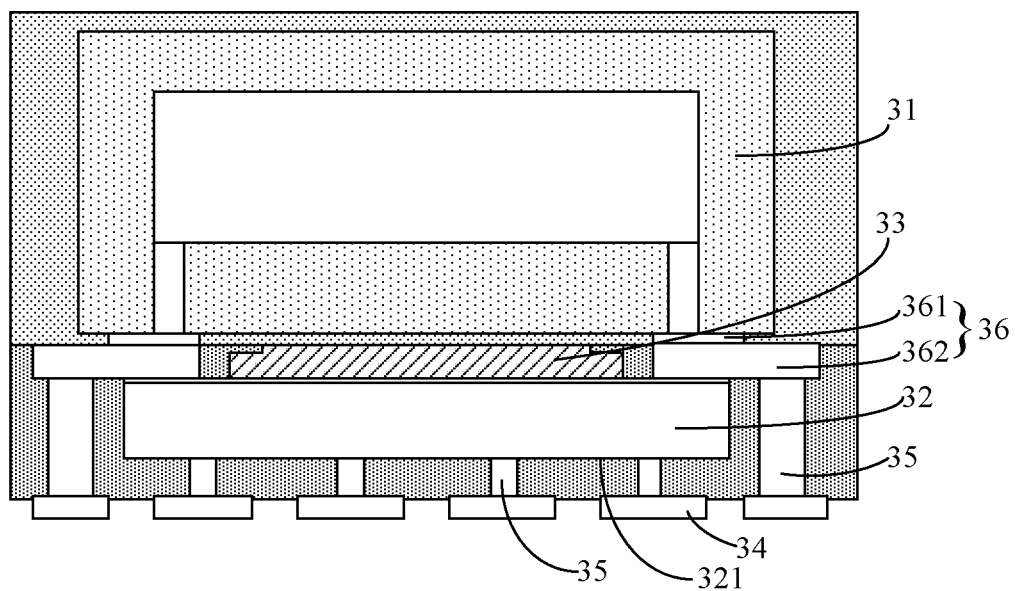
FIG. 5 is a sectional view of the second example package assembly, in accordance with embodiments of the present invention.

Referring now to FIGS. 4 and 5, shown are respective perspective (partial) and sectional views of a second example package assembly, in accordance with embodiments of the present invention. In this particular example, to more clearly show the specific structure of the heat dissipation structure, the perspective view (FIG. 4) omits the electronic component and encapsulator. For example, part 231 of heat dissipation structure can include middle part 331 and two side parts 332, where middle part 331 is rectangular while two side parts 332 are U-shaped such that the two side parts neighbor the pad structure 36. Here, the thickness of the heat dissipation structure can be such that the thickness of middle part 331 is greatest than the thickness of two side parts 332. That is, the plane of middle part 331 can be higher than the plane of two side parts 332. Further, middle part 331 of part 231 of the heat dissipation structure and metal layer 362 may be on the same plane, and two side parts 332 of the heat dissipation structure can be lower than metal layer 362. If the electronic component, heat dissipation structure, and die are encapsulated within the same encapsulator, middle part 331 of the heat dissipation structure may be disposed to be in contact with the electronic component.

In this example, the thickness of part 231 of the heat dissipation structure can be such that the plane of the middle part of part 231 of the heat dissipation structure is higher than the plane of two side parts of the heat dissipation structure adjacent to the metal layer. That is, the plane of the heat dissipation structures on the two sides adjacent to the pad structure 36 can be lower than metal layer 362, in order to prevent solder layer 361 from overflowing to weld the metal layer and the heat dissipation structure during the surface mounting process.

Figure 6:
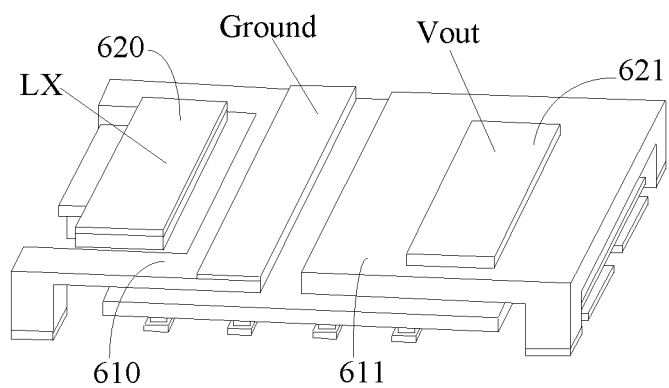
FIG. 6 is a perspective view of a part of a third example package assembly, in accordance with embodiments of the present invention.

Referring now to FIG. 6, shown is a perspective view (partial) of a third example package assembly, in accordance with embodiments of the present invention. Here, the package assembly of the buck converter is exemplified, and which can include a frame, a die for integrated power device and control circuit, an inductor, and a heat dissipation structure. For example, the die can be electrically connected to outer pins of the package assembly. The inductor can be located above the die and electrically connected to die, where the inductor can connect to the outer pins of the package assembly through conductive pillars. The heat dissipation structure can be located between the die and the inductor, in order to facilitate heat dissipation of the inductor.

For example, the die can be placed on the frame with a first surface of the die facing towards the frame. The inductor can be placed above the second surface of the die, and the inductor can connect to the frame through conductive pillars, where the first and second surfaces of the die are opposite to one another. The heat dissipation structure can be placed between the die and the inductor, in order to transmit heat generated by the inductor. The heat dissipation structure may surround switch nodes of the buck converter, in order to block radiation incurred during voltage transitions. In addition, the position of the heat dissipation structure relative to the inductor and the die may be arranged in order to prevent leakage fluxes from the inductor from interfering with the die. The frame can include the outer pins of the package assembly.

For example, the heat dissipation structure can include substructures 610 and 611, which are separated from each other. Pad structure 620 of the inductor can connect to the switch node LX, and another pad structure 621 of the inductor can connect to output voltage VOUT. As shown, when substructure 611 of the heat dissipation structure is to be electrically connected to the output voltage VOUT, substructure 611 may be integrally formed with the metal layer of pad structure 621 of the inductor, in order to form a conformal structure with the protruding part on top of the conformal structure serving as the soldered layer for pad structure 621.

In this particular example, substructure 610 of the heat dissipation structure can connect to the ground potential pin. Substructure 610 can connect to the frame, with the frame connected again to the ground potential pin. Since a large output voltage pin or a large ground potential pin is generally laid on the PCB layout, connecting the output voltage potential pin or ground potential pin with the heat dissipation structure can further benefit heat dissipation of the electronic component. In certain embodiments, the heat dissipation structure can also be separated into multiple smaller detachable substructures connected to other functions pins in accordance with circuit needs, or simply left suspended on its own.

In particular embodiments, a method of manufacturing the package assembly can include providing a die, electrically connected to outer pins of the package assembly, and installing an electronic component above the die that is electrically connected to the die. The method can also include forming a heat dissipation structure between the electronic component and the die to facilitate heat dissipation of the electronic component, where the heat dissipation structure physically isolate the electronic component and the die such that electromagnetic interference from the electronic component to the die can be prevented. The method can also include forming a frame, and installing a die on the frame, with the active surface of the die facing the frame. The method can also include installing an electronic component above a back surface of the die with the active and back surfaces of the die opposite to one another. The method can also include forming the heat dissipation structure between the electronic component and the die to isolate the two and prevent electromagnetic interference from the electronic component to the die, and the frame can include outer pins of the package assembly.

For example, the frame may be formed by the RDL process, or by stamping. In installing the die on the lead frame, electrodes of an active surface of the die can connect to the frame through conductive pillars, and the conductive pillars can connect to electrodes of an active surface die through a soldered layer. The heat dissipation structure can be formed using RDL techniques (e.g., through sputtering or plating) or through suitable processes/techniques. The heat dissipation structure can include a first part located on the die, and a second part extending towards the frame and connected to the first part.

Before installing the electronic component, the method also can include forming pad structures of the electronic component, which can include forming a metal layer and a soldered layer on the metal layer, where the metal layer neighbors the back surface of the die. Within, the heat dissipation structure can surround the pad structure of the electronic component, where the heat dissipation structure is located along the peripheries of the pad structure. This method can also include forming the first part of the heat dissipation layer simultaneous to forming the metal layer, where the first part of the heat dissipation structure neighbors the back surface of the die.

The method also can include forming the conductive pillars that connect to the metal layer, where the electronic component is connected to the frame through the pad structure and conductive pillars. In the process of forming the conductive pillars, the second part of the heat dissipation structure can be simultaneously formed, where one end of the second part can connect to the first part of the heat dissipation structure, and the other end is in direct contact with the frame. The method also can include forming an insulator film on the back surface of the die such that the heat dissipation structure and metal layer is isolated from the die.

The method also can include forming a encapsulator encapsulating the die, heat dissipation structure, and electronic component. Within, the heat dissipation structure can directly contact to a bottom surface of the electronic component. The method also can include alternatively forming two encapsulators, with a first encapsulator encapsulating the die, and the heat dissipation structure and a second encapsulator encapsulating the electronic component. Within, the heat dissipation structure may not be in contact with the electronic component. For example, the electronic component is either inductor, transformer, resistor, or capacitor.

The example method utilizing flip-die bonding in forming the package assembly of an embodiment can include providing a substrate, and simultaneously forming the metal layer and the first part of the heat dissipation structure on the substrate. In addition, the corresponding conductive pillars can be simultaneously formed and connected to the electronic component and the second part of the heat dissipation structure. The method can also include forming the conductive pillars on the active surface of the die. The method can also include attaching the back surface of the die to the substrate such that the die is attached onto the first part of the heat dissipation structure and parts of the metal layer. For example, the back surface of the die can include the insulating film to prevent the die direct contacting the metal layer and heat dissipation structure.

The method can also include forming a first encapsulator encapsulating the die and the heat dissipation structure such that a first surface of the encapsulator is in contact with the substrate, and forming outer pins on second surface of the first encapsulator. That is, part of the frame, and both surfaces of the first encapsulator can be opposite to one another. The method can also include removing the substrate. The method can also include flipping the first encapsulator, exposing the metal layer on its first surface, and forming a soldered layer on the metal layer such that the electronic component can be welded onto the soldered layer. The method can also include forming a second encapsulator encapsulating the electronic component.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A package assembly, comprising:
   a) a die electrically connected to outer pins of the package assembly;
   b) an electronic component located above the die and electrically connected to the die, wherein the electronic component is connected to the outer pins of the package assembly through conductive pillars, and wherein the electronic component is one of an inductor, a transformer, a resistor, and a capacitor; and
   c) a heat dissipation structure located between the die and the electronic component to facilitate heat dissipation of the electronic component, wherein the heat dissipation structure physically isolates the die and the electronic component such that electromagnetic interference from the electronic component to the die is substantially prevented.

2. The package assembly of claim 1, wherein at least part of the heat dissipation structure is exposed outside of the package assembly in order to export heat generated by the electronic component.

3. The package assembly of claim 1, wherein the heat dissipation structure comprises a first part located above the die, and a second part extending towards an outside of the package assembly and connected to the first part.

4. The package assembly of claim 3, wherein the second part of the heat dissipation structure is in contact with the outer pins of the package assembly.

5. The package assembly of claim 3, wherein:
   a) the package assembly further comprises a pad structure of the electronic component;
   b) the pad structure comprises a metal layer and a soldered layer on the metal layer; and
   c) the pad structure is connected to conductive pillars to realize electrical connection between the electronic component and the outer pins of the package assembly.

6. The package assembly of claim 5, wherein a shape of the first part of the heat dissipation structure is set to isolate it from the pad structures and increases a horizontal area of the heat dissipation structure.

7. The package assembly of claim 5, wherein the first part of the heat dissipation structure is set along peripheries of the pad structures.

8. The package assembly of claim 3, wherein the first part of the heat dissipation structure has uniform thickness throughout.

9. The package assembly of claim 5, wherein a thickness of the first part of the heat dissipation structure is set such that a plane of a middle part of the first part of the heat dissipation structure is higher than a plane of parts adjacent to the pad structures on two sides thereof, in order to prevent the soldered layer from being soldered together with the heat dissipation structure.

10. The package assembly of claim 5, wherein the heat dissipation structure comprises at least two mutually detached substructures, and at least one of the substructure is conformal to the metal layer of one of pad structure of the electronic component.

11. The package assembly of claim 9, wherein the middle part of the first part of the heat dissipation structure is on a same plane as the metal layer.

12. The package assembly of claim 1, wherein the heat dissipation structure is connected to a ground potential pin to increase heat dissipation of the electronic component.

13. The package assembly of claim 5, wherein a back surface of the die comprises a layer of insulator film, in order to insulate the heat dissipation structure and pad structures from the die.

14. The package assembly of claim 1, further comprising a frame for installing the die, wherein the frame comprises the outer pins of the package assembly.

15. The package assembly of claim 14, wherein the frame is formed by a redistribution layer (RDL) process.

16. A method of manufacturing a package assembly, the method comprising:
   a) providing a die electrically connected to outer pins of the package assembly;
   b) installing an electronic component above the die that is electrically connected to the die, wherein the electronic component is connected to the outer pins of the package assembly through conductive pillars, and wherein the electronic component is one of an inductor, a transformer, a resistor, and a capacitor; and
   c) forming a heat dissipation structure between the electronic component and the die to facilitate heat dissipation of the electronic component, wherein the heat dissipation structure physically isolates the electronic component and the die such that electromagnetic interference from the electronic component to the die is substantially prevented.

17. The method of claim 16, further comprising, prior to installing the electronic component, forming a pad structure of the electronic component comprising forming a metal layer and a soldered layer located on the metal layer such that the metal layer neighbors a back surface of the die.

18. The method of claim 17, wherein the forming the metal layer comprises forming a first part of the heat dissipation structure such that the first part neighbors the back surface of the die.

19. The method of claim 17, further comprising forming the conductive pillars connected to the pad structure such that the electronic component is connected to the outer pins of the package assembly by the pad structure and conductive pillars.

* * * * *